(12) United States Patent
Kim

(10) Patent No.: US 8,917,019 B2
(45) Date of Patent: Dec. 23, 2014

(54) ORGANIC LIGHT EMITTING DIODE DISPLAY, MANUFACTURING METHOD AND MANUFACTURING EQUIPMENT THEREOF

(75) Inventor: Hoon Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 300 days.

(21) Appl. No.: 13/197,900

(22) Filed: Aug. 4, 2011

(65) Prior Publication Data

US 2012/0146487 A1    Jun. 14, 2012

(30) Foreign Application Priority Data

Dec. 10, 2010 (KR) .................. 10-2010-0126488

(51) Int. Cl.
*H01L 51/50* (2006.01)
*H01L 51/52* (2006.01)
*H01L 27/32* (2006.01)

(52) U.S. Cl.
CPC ........ *H01L 51/5243* (2013.01); *H01L 51/5259* (2013.01); *H01L 27/3276* (2013.01); *H01L 51/5246* (2013.01)
USPC ......................................... 313/512; 313/504

(58) Field of Classification Search
USPC ................................ 313/500–512
See application file for complete search history.

(56) References Cited

U.S. PATENT DOCUMENTS

| 6,081,071 | A  | * | 6/2000 | Rogers ........................ | 313/512 |
| 6,589,675 | B2 | * | 7/2003 | Peng ........................... | 313/512 |
| 7,306,346 | B2 | * | 12/2007 | Fukuoka et al. ............... | 313/512 |
| 7,317,281 | B2 | * | 1/2008 | Hayashi et al. ................ | 313/512 |
| 8,093,512 | B2 | * | 1/2012 | Chen et al. .................... | 174/523 |
| 2001/0015618 | A1 | * | 8/2001 | Yamazaki et al. ........... | 313/505 |
| 2002/0155320 | A1 | * | 10/2002 | Park et al. ...................... | 313/512 |
| 2006/0197446 | A1 | * | 9/2006 | Tomimatsu et al. .......... | 313/512 |
| 2007/0172971 | A1 | * | 7/2007 | Boroson ........................ | 438/26 |

FOREIGN PATENT DOCUMENTS

| JP | 10-134959 | 5/1998 |
| KR | 10-2007-0067506 | 6/2007 |
| KR | 10-2010-0017043 | 2/2010 |
| KR | 10-2010-0066883 | 6/2010 |

\* cited by examiner

*Primary Examiner* — Mariceli Santiago

(74) *Attorney, Agent, or Firm* — Robert E. Bushnell, Esq.

(57) ABSTRACT

A method for manufacturing an OLED display according to an exemplary embodiment comprises: forming a thermosetting adhesive layer having a getter receiving portion on a metal sheet; forming a display unit including a plurality of pixels on a substrate; forming a getter layer at an external side of the display unit on the substrate; adhering the thermosetting adhesive layer and the metal sheet to the substrate so as to locate the getter layer in the getter receiving unit; and hardening the thermosetting adhesive layer. The forming of the thermosetting adhesive layer includes layering a solid thermosetting adhesive sheet which has been patterned so as to have the getter receiving portion on the metal sheet.

12 Claims, 19 Drawing Sheets

ORGANIC LIGHT EMITTING DIODE DISPLAY, MANUFACTURING METHOD AND MANUFACTURING EQUIPMENT THEREOF

CLAIM OF PRIORITY

This application claims priority to and the benefit of Korean Patent Application No. 10-2010-0126488 filed in the Korean Intellectual Property Office on Dec. 10, 2010, the entire contents of which are incorporated herein by reference.

BACKGROUND OF THE INVENTION

1. Field of the Invention

The described technology relates generally to an organic light emitting diode (OLED) display. More particularly, the described technology relates generally to a sealing technology for sealing a display unit.

2. Description of the Related Art

An organic light emitting diode (OLED) display is a self-emissive display which displays an image with a self-emissive organic light emitting element. Since a display unit, including a plurality of organic light emitting elements, is deteriorated in function when it is exposed to moisture and oxygen, technology for preventing external moisture and oxygen from permeating by sealing the display unit has been required.

The above information disclosed in this Background section is only for enhancement of an understanding of the background of the described technology, and therefore it may contain information which does not form the prior art which is already known in this country to a person of ordinary skill in the art.

SUMMARY OF THE INVENTION

The described technology has been made in an effort to provide an organic light emitting diode (OLED) display which can be manufactured with ease, which has improved display quality and useful life-span by enhancing a sealing function of a display unit, and which has an excellent head dissipation effect, and a manufacturing method thereof.

A method for manufacturing an OLED display according to an exemplary embodiment comprises: forming a thermosetting adhesive layer having a getter receiving portion on a metal sheet; forming a display unit including a plurality of pixels on a substrate; forming a getter layer at an external side of the display unit on the substrate; adhering the thermosetting adhesive layer and the metal sheet on the substrate so as to locate the getter layer in the getter receiving unit; and hardening the thermosetting adhesive layer.

The forming of the thermosetting adhesive layer may include layering a solid thermosetting adhesive sheet which has been patterned to have the getter receiving portion on the metal sheet. The forming of the thermosetting adhesive layer may be performed through a roll-to-roll continuous process.

The forming of the thermosetting adhesive layer may include: a first step of preparing a solid thermosetting adhesive sheet to which a release paper is attached; a second step of adhering an adhesive sheet to an external side of the release paper; a third step of forming a half-cut cut line in the solid thermosetting adhesive sheet and the release paper, matching the shape of the getter receiving portion using a punching device; a fourth step of removing the adhesive sheet and a cut portion formed due to the half-cut cut line by striping the adhesive sheet; and a fifth step of adhering a metal sheet and a protection film to an external side of the solid thermosetting adhesive sheet and an external side of the release paper, respectively.

The solid thermosetting adhesive sheet may sequentially pass through the first to fifth steps while being transferred in one direction by a plurality of driving rolls.

The getter receiving portion may be formed in parallel with an edge of the metal sheet while having a distance therebetween.

The forming of the getter layer may comprise a process for coating a paste-like mixture, including a getter material, on an external side of the display unit, and then drying the coated mixture. The getter material may include at least one of barium oxide, calcium oxide, magnesium oxide, lithium oxide, sodium oxide, potassium oxide, lithium sulfate, sodium sulfate, calcium sulfate, magnesium sulfate, potassium sulfate, potassium chlorate, magnesium chloride, calcium bromide, cesium bromide, vanadium bromide, and, calcium nitride.

The substrate and the metal sheet may be adhered to each other through a roll lamination process or a vacuum assembly process.

An OLED display according to another exemplary embodiment comprises: a substrate; a display unit formed on the substrate and including a plurality of pixels; a getter layer disposed at an external side of the display unit on the substrate; a thermosetting adhesive layer disposed on the display unit; and a metal sheet fixed on the thermosetting adhesive layer.

The thermosetting adhesive layer may be divided into a first area disposed at an inner side of the getter layer and a second area disposed at an outer side of the getter layer. The first area may be sealed to the display unit and disposed between the display unit and the metal sheet along a thickness direction of the substrate. The second area may be formed along an edge of the metal sheet so as to adhere the substrate to the metal sheet.

The getter layer may be disposed at a distance from the thermosetting adhesive layer.

The OLED display may further include an insulation sheet fixed on the metal sheet. The display unit may include a common power line and a common electrode, and the metal sheet may include a first metal sheet connected to the common electrode so as to supply a first electric signal to the common electrode, and a second metal sheet connected to the common power line so as to supply a second electric signal to the common power line.

The OLED display may further include: a first pad portion disposed at an external side of the thermosetting adhesive layer and connected to the common electrode; a second pad portion disposed at the external side of the thermosetting adhesive layer and connected to the common power line; and conductive adhering layers disposed between the first pad portion and the first metal sheet, and between the second pad portion and the second metal sheet. The conductive adhering layer may have conductivity along the thickness direction of the substrate, and may become insulative along directions other than the thickness direction.

The OLED display may further include a third metal sheet fixed to an external side of the insulation sheet and connected to the first metal sheet by a first conductive connection portion penetrating through the insulation sheet, and a fourth metal sheet fixed to the external side of the insulation sheet at a distance from the third metal sheet and connected to the second metal sheet by a second conductive connection portion penetrating through the insulation sheet.

Manufacturing equipment for an OLED display according to another exemplary embodiment comprises: a first driving roll, a second driving roll, and a third driving roll arranged in parallel with each other along one direction, and transferring a solid thermosetting adhesive sheet unwound from a first spiral-wound roll; a second spiral-wound roll disposed at a front side of the first driving roll, and controlling an adhesive sheet to be layered on the solid thermosetting adhesive sheet by unwinding the adhesive sheet; a punching device, including a cutting cutter which is disposed at a rear side of the first driving roll and which moves up and down, and forming a half-cut cutting line at the solid thermosetting adhesive sheet; a third spiral-wound roll disposed at a rear side of the punching device and the second driving roll, and collecting the adhesive sheet and a cut-out portion formed due to the half-cut cutting line by rolling the same; and fourth and fifth spiral-wound rolls disposed at a front side of the third driving roll, and unwinding a metal sheet and a protection film, respectively, so as to control the metal sheet and the protection film to be layered at both sides of the thermosetting adhesive sheet.

The solid thermosetting adhesive sheet may include a release paper attached to one side thereof, and the second spiral-wound roll may be arranged so that the adhesive sheet is adjacent to the release paper. The fourth spiral-wound roll may be arranged so that the metal sheet is attached to an external side of the solid thermosetting adhesive sheet, and the fifth spiral-wound roll may be arranged so that the protection film is attached to an external side of the release paper.

According to the exemplary embodiments, a thermosetting adhesive layer which has been patterned to have a getter receiving portion on a metal sheet is formed such that a thermosetting adhesive layer can be easily formed on a large-sized metal sheet, and a process failure can be minimized by preventing deformation or damage to the metal sheet. Furthermore, a large-sized OLED display which is greater than 30 inches can be easily manufactured, and the sealing function of the display unit is improved so that display quality can be enhanced and useful life-span can be extended.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
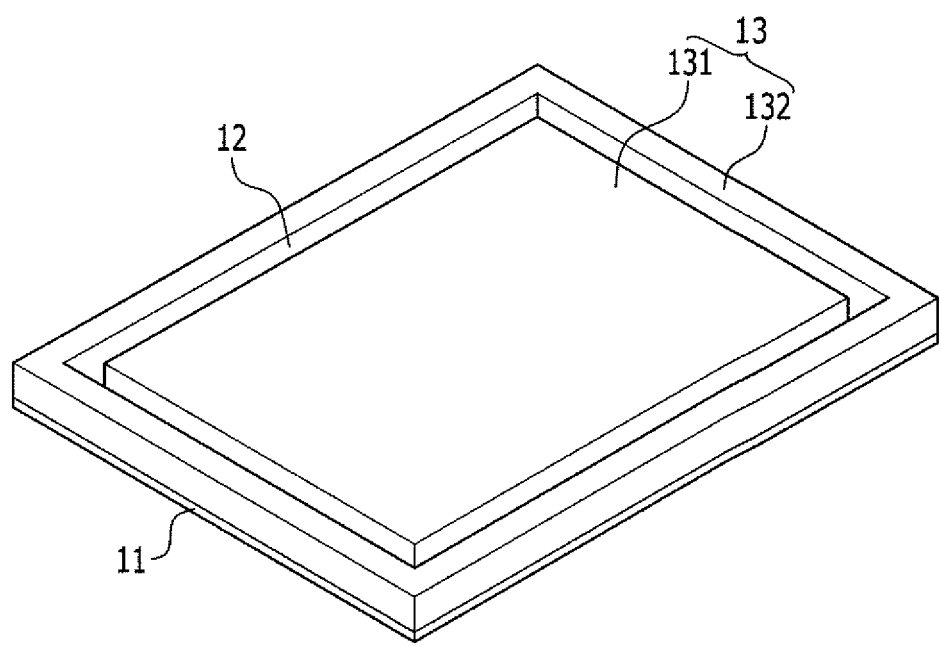
FIG. 1A thru FIG. 1D are schematic diagrams of a manufacturing process of an organic light emitting diode (OLED) display according to an exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of the components shown in the drawings are optionally determined for better understanding and ease of description, and the present invention is not limited to the examples shown in the drawings.

It will be understood that, when an element such as a layer, film, region or substrate is referred to as being "on" another element, it can be directly on the other element or intervening elements may also be present. Furthermore, in the specification and the claims which follow, when it is described that an element is "coupled" to another element, the element may be "directly coupled" to the other element or "electrically coupled" to the other element through a third element.

FIG. 1A thru FIG. 1D are schematic diagrams of manufacturing processes of an organic light emitting diode (OLED) display according to an exemplary embodiment of the invention.

Referring to FIG. 1A, a metal sheet 11 is prepared, and a thermosetting adhesive layer 13 having a getter receiving portion 12 is formed on one side of the metal sheet 11.

The metal sheet 11 functions as a sealing member which replaces a conventional glass substrate in the OLED display. The metal sheet 11 may be formed with aluminum, an aluminum alloy, copper, or a copper alloy, and excellently prevents external moisture and oxygen from permeating. The metal sheet 11 has an excellent heat dissipation effect and low manufacturing expense compared to a glass substrate so that it may be more efficiently used in a large-sized OLED display which is greater than 30 inches.

The getter receiving portion 12 is a portion where the thermosetting adhesive layer 13 is not formed, and thus exposes the surface of the metal sheet 11. The getter receiving portion 12 is disposed in parallel with an edge of the metal sheet 11 at a distance therefrom, and may have a constant width.

The thermosetting adhesive layer 13 may include thermosetting polymer resin, for example, epoxy resin. The thermosetting adhesive layer 13 is divided into a first area 131 disposed at an inner side of the getter receiving portion 12 and a second area 132 disposed at an outer side thereof. In the OLED display, the first area 131 functions as a hygroscopic filler and the second area 132 functions as an adhesive layer which adheres the substrate to the metal sheet 11.

In this case, since the metal sheet 11 is easily bent while it is being handled, it is difficult to apply a process for coating a liquid or paste type thermosetting polymer material, and a process for patterning the thermosetting adhesive layer after the coating. Thus, the thermosetting adhesive layer 13 is formed of a solid thermosetting adhesive sheet, and may be attached to the metal sheet 11 after being patterned so as to have the getter receiving portion 12.

FIG. 2A thru FIG. 2F are schematic diagrams of a detailed process for forming a metal sheet and a thermosetting adhesive layer of FIG. 1A.

Figure 2A:
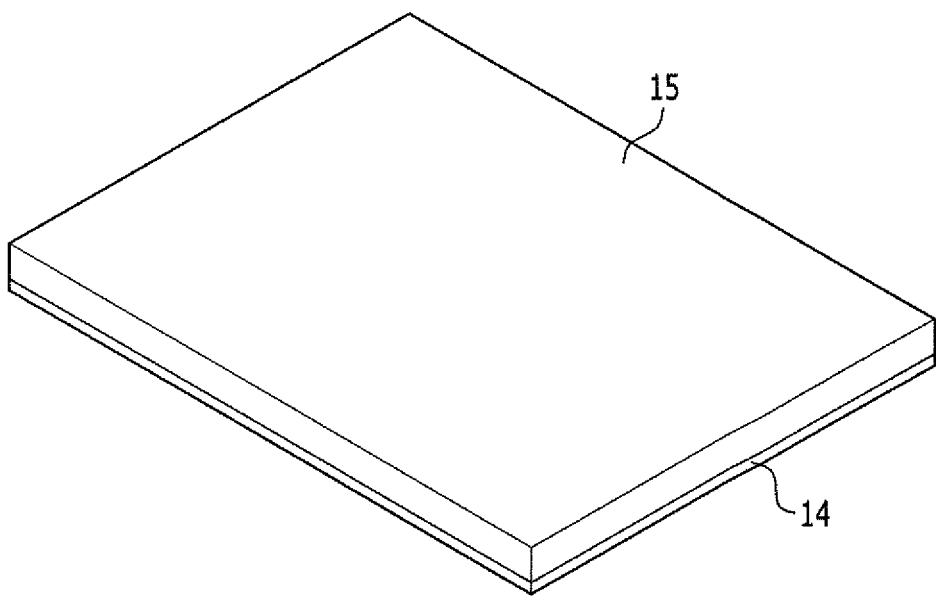
FIG. 2A thru FIG. 2F are schematic diagrams of detailed processes for forming a metal sheet and a thermosetting adhesive layer of FIG. 1A.
Figure 2B:
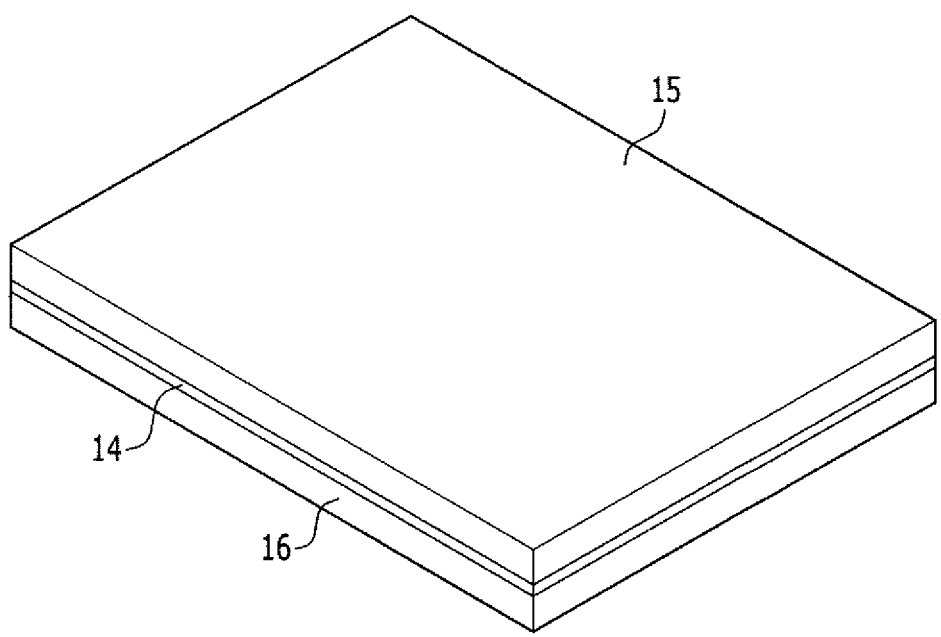
Figure 2C:
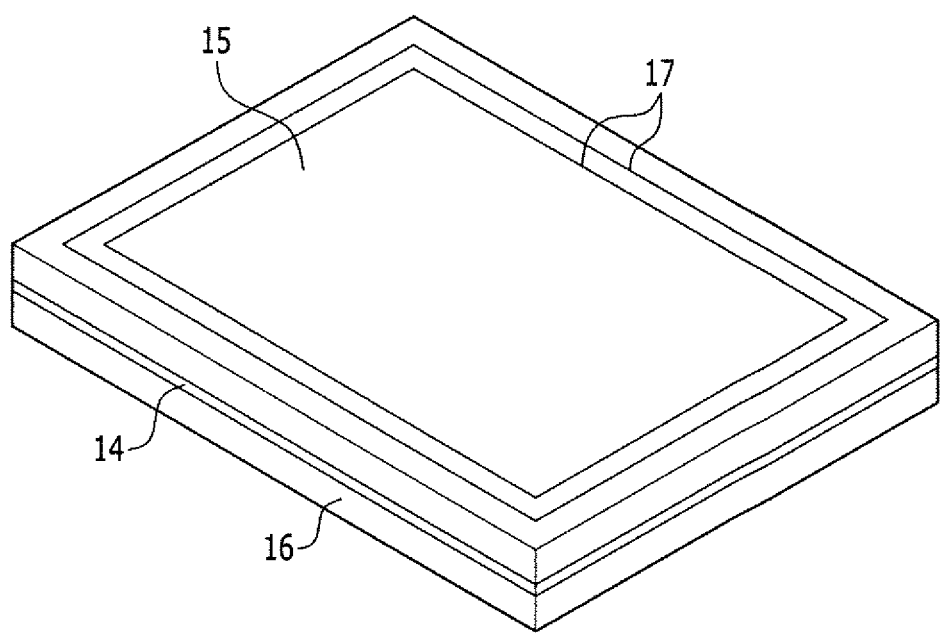

Referring to FIG. 2A thru FIG. 2F, the thermosetting adhesive sheet 15 having a release paper 14 attached to one side thereof is prepared (FIG. 2A), and an adhesive sheet 16 is attached to the external side of the release paper 14 (FIG. 2B). Subsequently, a half-cut cut line 17 is formed in the solid thermosetting adhesive sheet 15 and the release paper 14 matching the shape of the getter receiving portion using a punching device (not shown) (FIG. 2C).

Figure 2D:
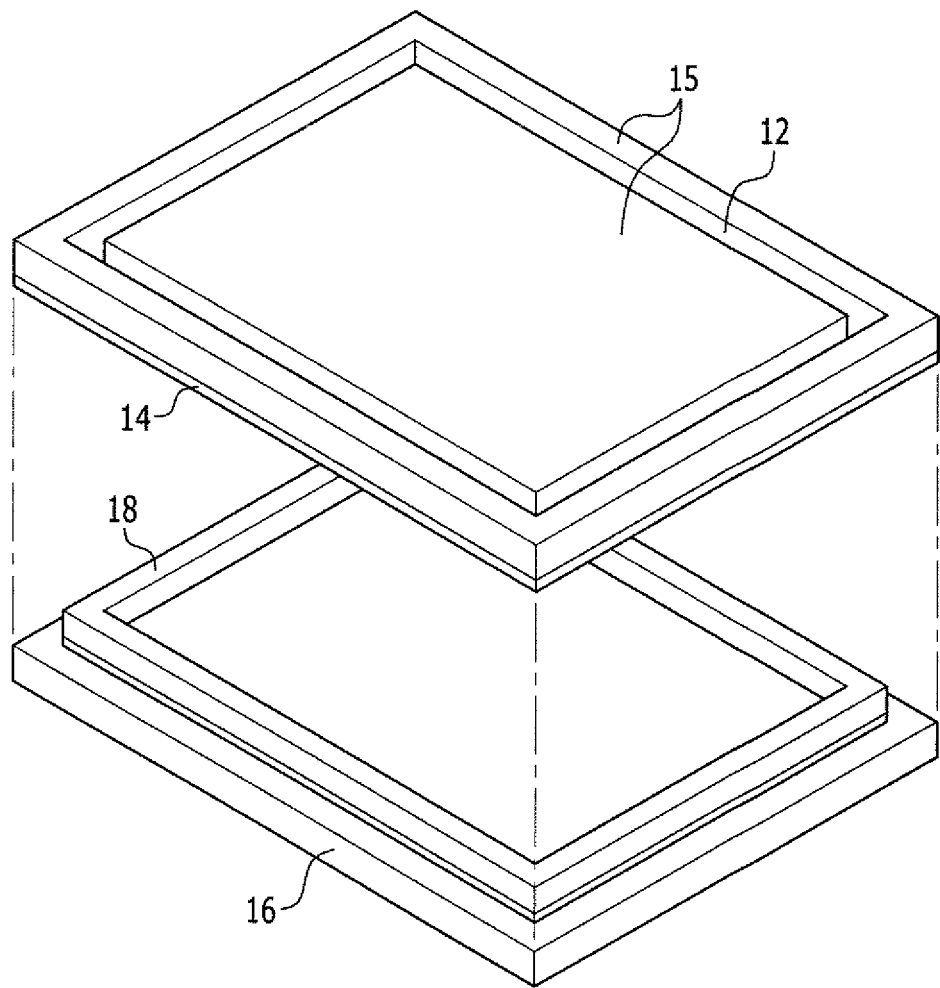
Figure 2E:
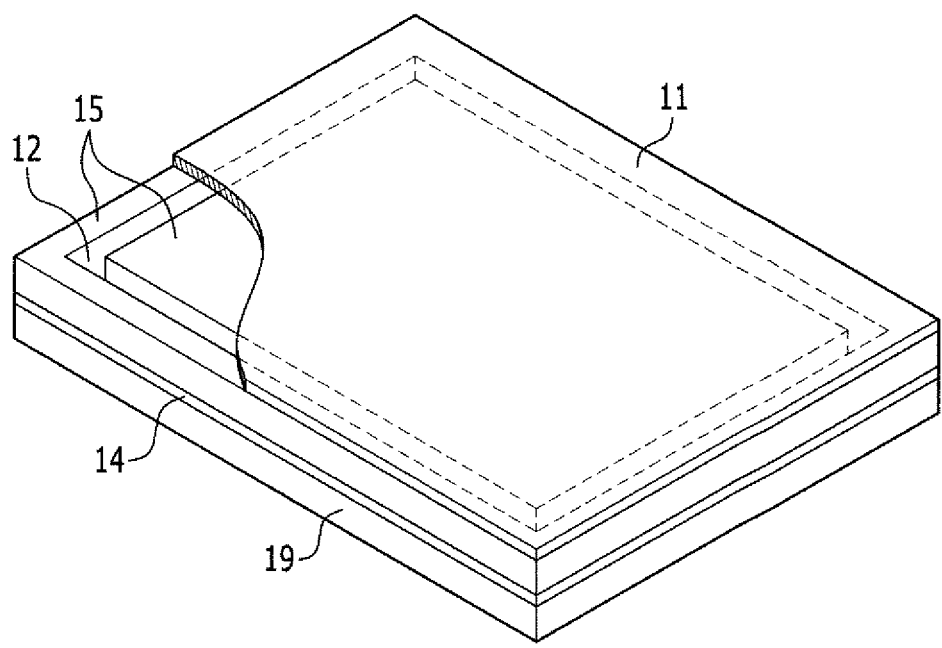
Figure 2F:
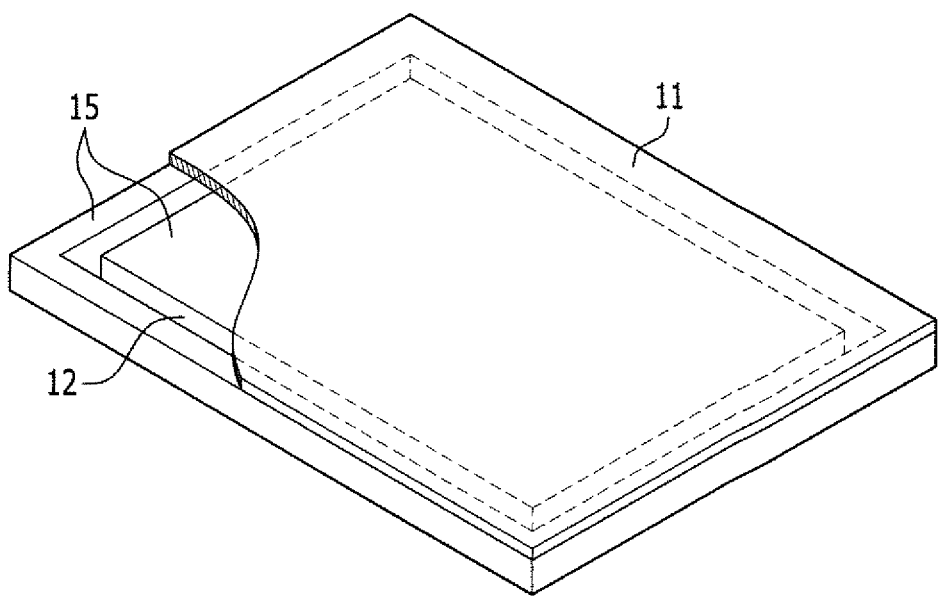

Next, the adhesive sheet 16 is detected, and then a cut portion 18 is eliminated together with the adhesive sheet 16 along the half-cut cut line 17 so as to form the getter receiving portion 12 in the solid thermosetting adhesive sheet 15 (FIG. 2D). After that, a protection film 19 is attached to the outer side of the release paper 14, and the metal sheet 11 is layered on the solid thermosetting adhesive sheet 15 (FIG. 2E). Before the metal sheet 11 and the solid thermosetting adhesive sheet 15 (thermosetting adhesive layer) are attached to the substrate, the release paper 14 and the protection film 19 are removed (FIG. 2F).

As described, the thermosetting adhesive layer 13, which has been patterned to have the getter receiving portion 12 on the metal sheet 11 which is easily bent, can be easily formed by applying the solid thermosetting adhesive sheet 15 and the punching process. The above-stated processes may be performed through a roll-to-roll process, and this process is illustrated in FIG. 3.

Figure 3:
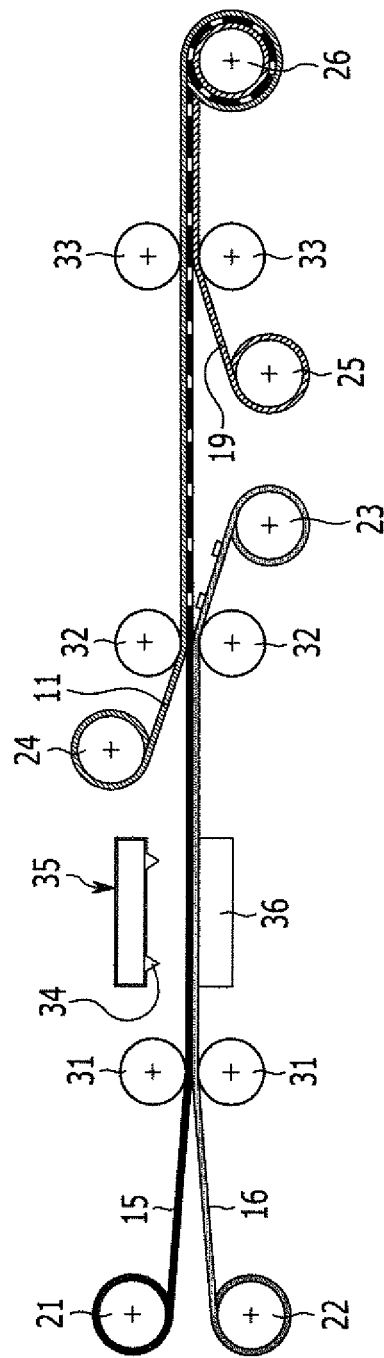
FIG. 3 is a schematic diagram of manufacturing equipment for the OLED display according to the exemplary embodiment of the invention.

FIG. 3 is a schematic diagram of manufacturing equipment for the OLED display according to the exemplary embodiment of the invention.

Referring to FIG. 3, the solid thermosetting adhesive sheet 15, to which the release paper is attached, is inserted in the manufacturing equipment while being wound to a first spiral-wound roll 21, and the adhesive sheet 16 is inserted in the manufacturing equipment while being wound to a second spiral-wound roll 22. The solid thermosetting adhesive sheet 15 unwound from the first spiral-wound roll 21, and the adhesive sheet 16 unwound from the second spiral-wound roll 22, are pressed while being transferred in one direction by the first driving roll 31 such that the adhesive sheet 16 is attached to the external side of the release paper.

The punching device 35, including a cutting cutter 34, and a support 36 are disposed at a rear side of the first driving roll 31. The support 36 is disposed at a lower portion of the adhesive sheet 16 and the punching device 35 is disposed at an upper portion of the solid thermosetting adhesive sheet 15. The cutting cutter 34 of the punching device 35 is lowered so that a half-cut cutting line is formed at the solid thermosetting adhesive sheet 15 and the release paper.

A second driving roll 32 is disposed at a rear side of the punching device 35, and a third spiral-wound roll 23 which collects the adhesive sheet 16 by rolling the same is disposed at a rear side of the second driving roll 32. Thus, when the solid thermosetting adhesive sheet 15 passes through the second driving roll 32, the adhesive sheet 16 and the cut-out portion indicated by the half-cut cutting line are removed from the solid thermosetting adhesive sheet 15.

In addition, a fourth spiral-wound roll 24 for unwinding the metal sheet 11 is disposed at a front side of the second driving roll 32, and a fifth spiral-wound roll 25 for unwinding the protection film 19 and a third driving roll 33 are disposed at a rear side of the third spiral-wound roll 23.

When the solid thermosetting adhesive sheet 15 passes through the second driving roll 32, the metal sheet 11 is attached to an outer side of solid thermosetting adhesive sheet 15, and when the solid thermosetting adhesive sheet 15 passes through the third driving roll 33, the protection film 19 is attached to an outer side of the release paper. The metal sheet 11, the solid thermosetting adhesive sheet 15 and the protection film 19 are wound around a sixth spiral-wound roll 26 and then stored.

Through the above-stated roll-to-roll process, a large-sized metal sheet 11 and a large-sized thermosetting adhesive layer 13 can be easily manufactured with low cost. In addition, deformation (e.g., crumple) or damage (e.g., break) of the metal sheet 11 is prevented so that process failure can be minimized.

Figure 1B:
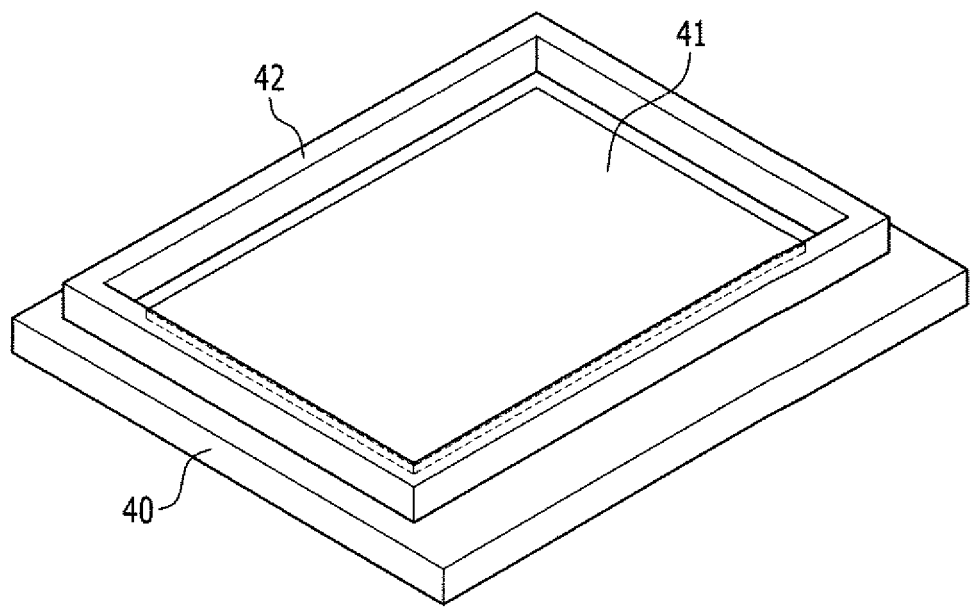

Referring to FIG. 1B, a display unit 41 is formed on the substrate 40. The display unit 41 includes a plurality of pixels, and an organic light emitting element and a driving circuit are disposed in each pixel. The substrate 40 is formed with transparent glass or a transparent polymer film, and light emitted from the display unit 41 is passed through the substrate 40 and then emitted to the outside.

The organic light emitting element includes a hole injection electrode (anode), an organic emission layer, and an electron injection electrode (cathode). The driving circuit controls driving of the organic light emitting element, and is formed of at least two thin film transistors, including a switching thin film transistor and a driving thin film transistor, and at least one capacitor. For convenience, FIG. 1B schematically illustrates the display unit 41 as a single layer.

A getter layer 42 is formed at the outer side of the display unit 41 on the substrate 40. The getter layer 42 may be a thick film getter layer, and may be formed through a process of coating (e.g., dispensing or screen-printing) a paste-like mixture, including a getter material, on an external side of the display unit 41, and then drying the coated mixture.

As a material absorbing moisture and oxygen, the getter material includes, for example, at least one of barium oxide, calcium oxide, magnesium oxide, lithium oxide, sodium oxide, potassium oxide, lithium sulfate, sodium sulfate, calcium sulfate, magnesium sulfate, potassium sulfate, potassium chlorate, magnesium chloride, calcium bromide, cesium bromide, vanadium bromide, and, calcium nitride.

The getter layer 42 is disposed at the same location as the getter receiving portion 12 of the thermosetting adhesive layer 13 in FIG. 1A, and has a thickness which is smaller than that of the getter receiving portion 12 so as to maintain a predetermined distance with the thermosetting adhesive layer 13 when attaching the substrate 40 and the metal sheet 11. In the OLED display, the getter layer 42 absorbs moisture and oxygen intruding into the OLED display through a gap between the substrate 40 and the metal sheet 11 so as to thereby suppress deterioration of the display unit 41.

When an unpatterned solid thermosetting adhesive sheet is attached to the metal sheet 11, a getter layer cannot be formed between the substrate 40 and the metal sheet 11 so that the sealing function of the display unit 41 is deteriorated, thereby decreasing reliability of the OLED display. Furthermore, when the solid thermosetting adhesive sheet is patterned on the metal sheet 11 so as to form the getter receiving portion 12, the metal sheet 11 may be damaged during the patterning process.

In the present exemplary embodiment, the solid thermosetting adhesive sheet is patterned first to form the getter receiving portion 12, and then the getter receiving portion 12 is attached to the metal sheet 11 so that the above-stated problems can be solved.

Figure 1C:
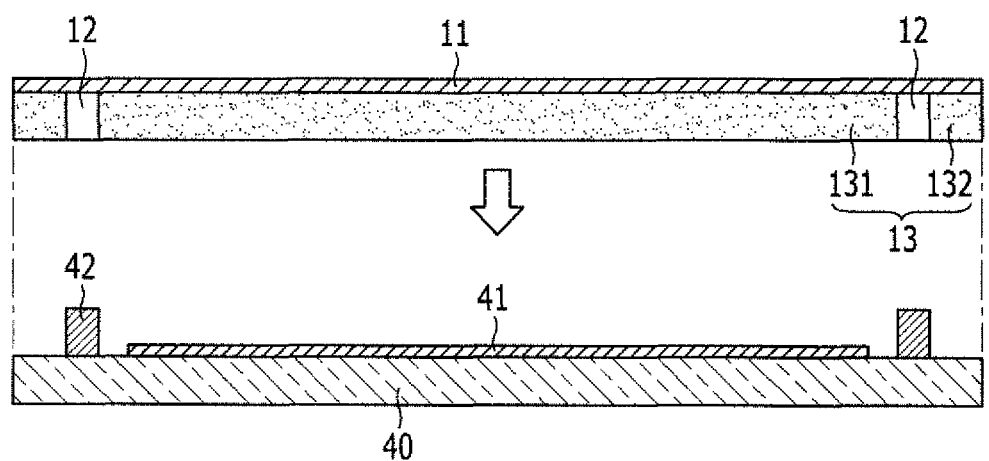
Figure 1D:
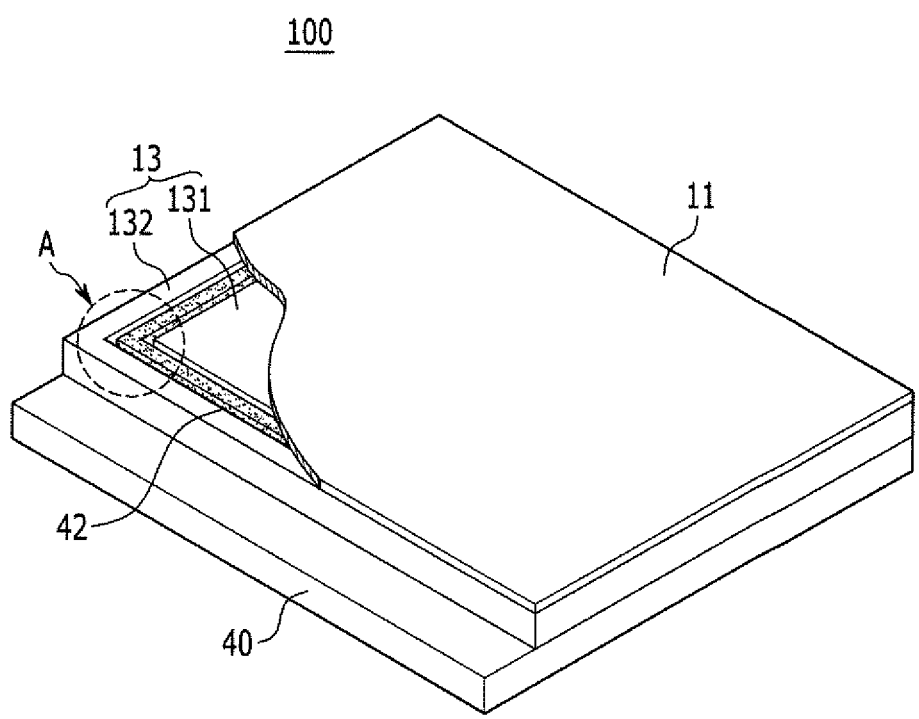

Referring to FIG. 1C and FIG. 1D, the metal sheet 11 is arranged on the substrate 40 so as to make the thermosetting adhesive layer 13 face the display unit 41, and then the substrate 40 and the metal sheet 11 are attached to each other. In this case, the getter layer 42 is disposed in the getter receiving portion 12 of the thermosetting adhesive layer 13. Attachment of the substrate 40 and the metal sheet 11 may be performed through roll lamination or vacuum assembly.

During the roll lamination process, a pressing roll is arranged on the metal sheet 11 and the pressing roll presses the metal sheet 11 and the thermosetting adhesive layer 13 on the substrate 40 in one direction by rotating and simultaneously moving so as to thereby attach the metal sheet 11 and the thermosetting adhesive layer 13 to the substrate 40. During the vacuum assembly process, the temporarily assembled substrate 40 and metal sheet 11 are arranged in a vacuum chamber, and vacuum pressure is applied to the substrate 40 and the metal sheet 11 in the vacuum chamber so as to attach the two members.

Subsequently, the thermosetting adhesive layer 13 is hardened by using a hot plate or a high temperature chamber to complete the OLED display 100. The thermosetting adhesive layer 13 passed through the hardening process is firmly attached to both the substrate 40 and the metal sheet 11.

With respect to the thermosetting adhesive layer 13, the first area 131 disposed at the inner side of the getter receiving portion 12 functions as a hygroscopic filler which covers the same by being attached thereto. In this case, the first area 131 may be larger than the display unit 41. The second area 132 at the outer side of the getter layer 42 is attached to the substrate 40 so as to function as an adhesive layer for adhering the metal sheet 11 to the substrate 40. The second area 132 is formed in the shape of a rectangular frame along the edge of the metal sheet 11.

Figure 4:
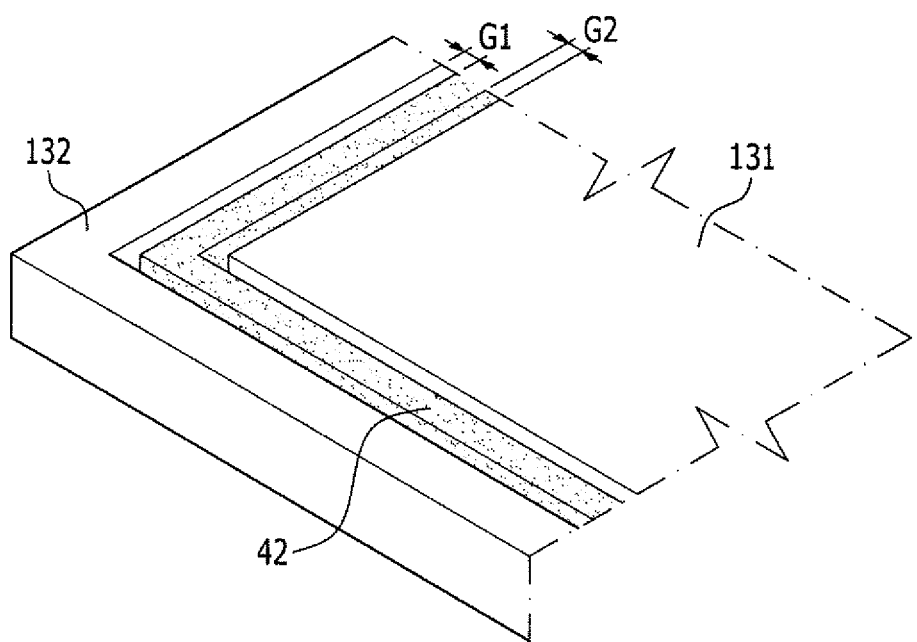
FIG. 4 is an enlarged view of area A in FIG. 1D.

FIG. 4 is an enlarged view of area A in FIG. 1D.

Referring to FIG. 4, the getter layer 42 maintains a predetermined distance with respect to the thermosetting adhesive layer 13 through the process of assembling the substrate 40 and the metal sheet 11. That is, the getter layer 42 maintains a first gap G1 with the first area 131 of the thermosetting adhesive layer 13, and maintains a second gap G2 with the second area 132. The first gap G1 and the second gap G2 are set to be greater than assembly tolerance of the substrate 40 and the metal sheet 11 so that the getter layer 42 does not overlap the thermosetting adhesive layer 13 during the assembly process of the substrate 40 and the metal sheet 11. The getter layer 42 and the thermosetting adhesive layer 13 are pressed through the assembling process of the substrate 40 and the metal sheet 11 using the roll rumination or vacuum assembly so that a gap between the getter layer 42 and the thermosetting adhesive layer 13 may be decreased compared to an initial gap, or the getter layer 42 and the thermosetting adhesive layer 13 may be attached to each other.

In the completed OLED display 100, the display unit 41 is covered by the first area 131 of the thermosetting adhesive layer 13 and the metal sheet 11 along the thickness direction of the substrate 40, and is covered by the first area 131 of the thermosetting adhesive layer 13, the getter layer 42 and the second area 132 along a planar direction of the substrate 40. That is, the thermosetting adhesive layer 13, including the first area 131, the second area 132, the getter layer 42 and the metal sheet 11, form a sealing member which covers the display unit 41 for protection.

Among the external moisture and oxygen intruding into the OLED display 100, components intruding along the thickness direction of the OLED display 100 are blocked by the metal sheet 11 and then blocked by the first area 131 of the thermosetting adhesive layer 13. In addition, components intruding along the planar direction of the substrate 40 between the substrate 40 and the metal sheet 11 are blocked by the second area 132 of the thermosetting adhesive layer 13, secondarily blocked by the getter layer 42, and then blocked by the first area 131 of the thermosetting adhesive layer 13.

Thus, deterioration of the display unit 41 can be suppressed by improving the sealing function of the display unit 41, and accordingly the display quality can be improved and life-span can be extended. Furthermore, a sealing member of an OLED display 100 larger than 30 inches can be easily manufactured using the metal sheet 11 and a pre-patterned adhesive sheet.

Meanwhile, the metal sheet 11 may function not only as the sealing member but also as a wire transmitting an electric signal in the OLED display 100.

Figure 5:
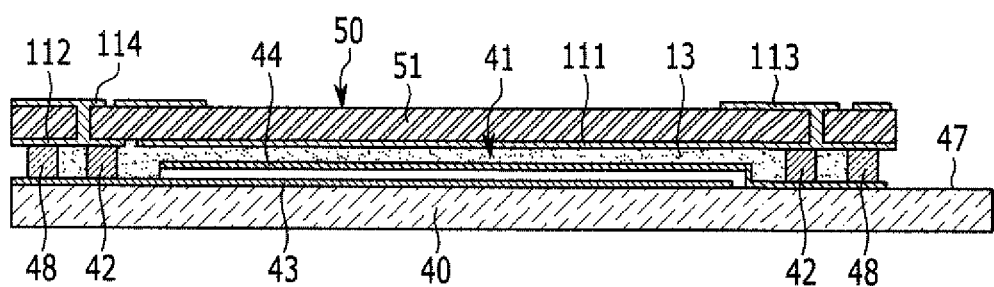
FIG. 5 is a cross-sectional view of an OLED display according to another exemplary embodiment of the invention.

FIG. 5 is a schematic cross-sectional view of an OLED display according to another exemplary embodiment of the invention.

Referring to FIG. 5, an OLED display 200 includes an insulation sheet 51 fixed on metal sheets 111 and 112. The metal sheets 111 and 112 and the insulation sheet 50 form a sealing member 50. The metal sheets 111 and 112 are divided into a first metal sheet 111 for applying a first electric signal and a second metal sheet 112 for applying a second electric signal.

A gate line, a data line and a common power line 43 are disposed at each pixel in a display unit 41. The gate line transmits a scan signal and the data line transmits a data signal. The common power line 43 applies a common voltage to a driving thin film transistor. The common power line 43 includes a first common power line which is parallel with the data line and a second common power line which is parallel with the gate line.

An organic light emitting element includes a pixel electrode, an organic emission layer, and a common electrode 44. The pixel electrode is connected to a thin film transistor of the corresponding pixel, and the common electrode 44 is commonly formed through the plurality of pixels. A detailed structure of the display unit will be described later, and FIG. 5 schematically illustrates the common power line 43 and the common electrode 44 as a single layer.

Figure 6:
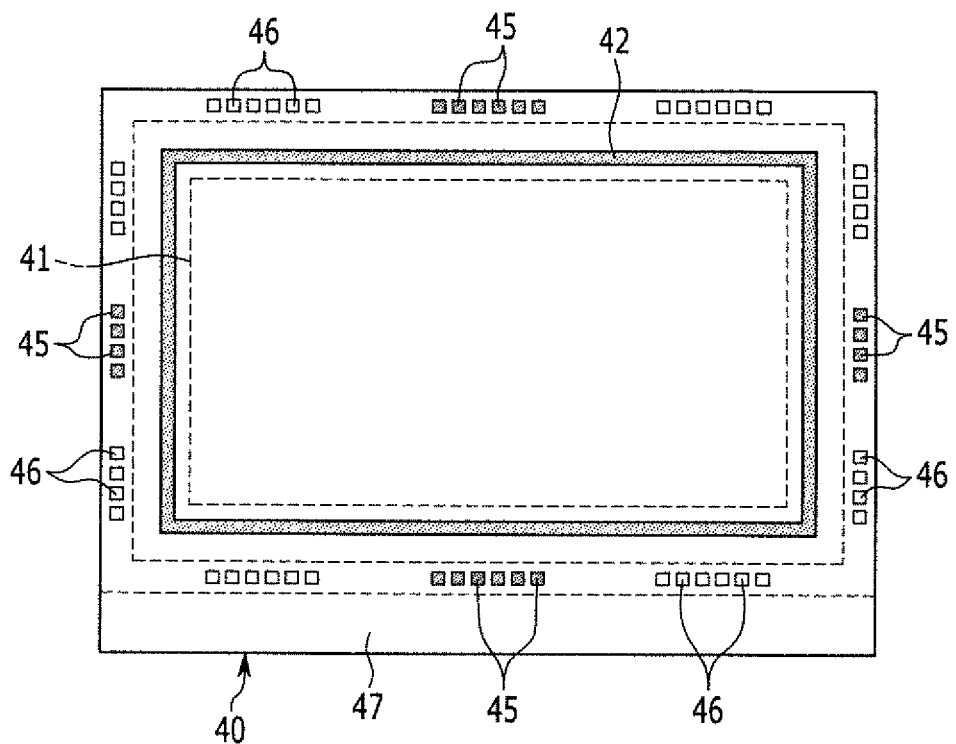
FIG. 6 is a top plan view of a substrate of the OLED display of FIG. 5.

FIG. 6 is a top plan view of a substrate of the OLED display of FIG. 5.

Referring to FIG. 5 and FIG. 6, first pad portions 45 and second pad portions 46 are disposed on a substrate 40 at an outer side of a thermosetting adhesive layer 13. The first pad portions 45 are connected to the common electrode 44, and the second pad portions 46 are connected to the common power line 43. The first pad portions 45 and the second pad portions 46 are disposed, with a distance therebetween, at four external edges of the display unit 41, and a pad area 47 is disposed at one edge of the substrate 40.

FIG. 6 illustrates the first pad portions 45 using a dotted pattern for distinguishing the first pad portions 45 and the second pad portions 46. Furthermore, FIG. 6 schematically illustrates the first pad portions and the second pad portions, and the location and the number of first and second pad portions are not limited thereto.

Figure 7:
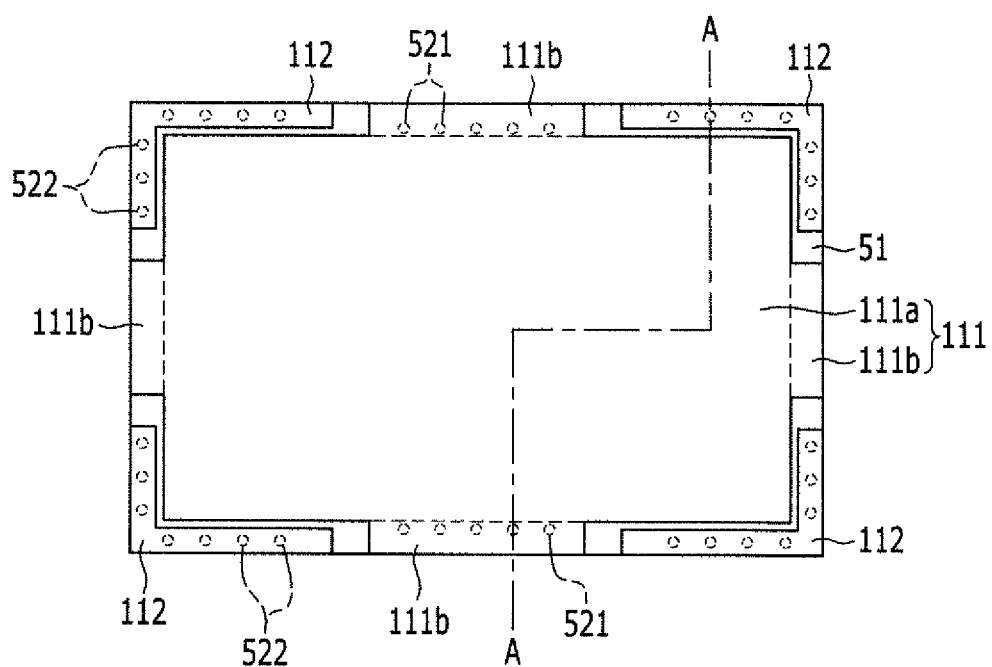
FIG. 7 is a top plan view of an inner side of a sealing member in the OLED display of FIG. 5.
Figure 8:
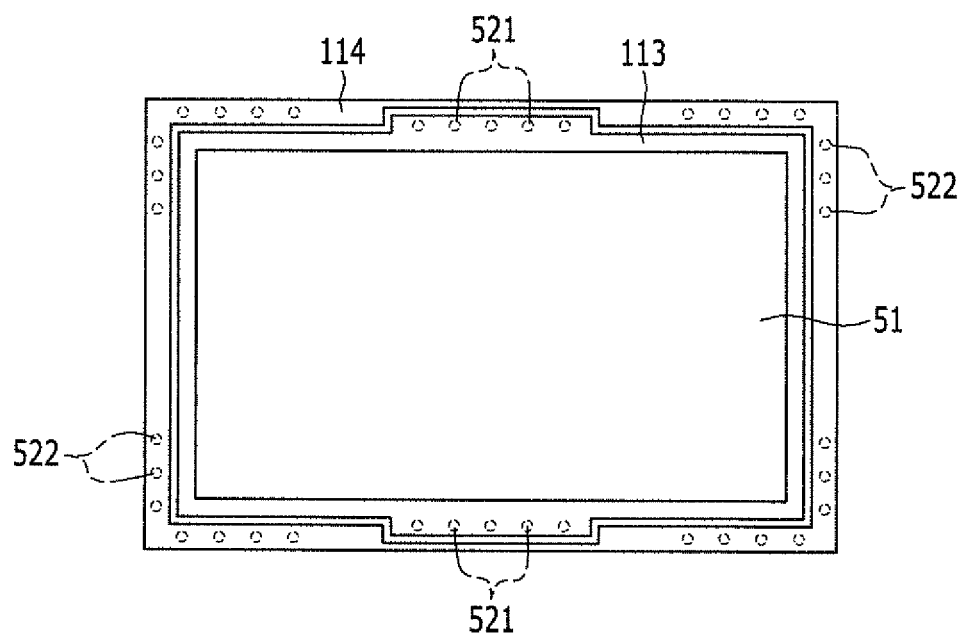
FIG. 8 is a top plan view of an outer side of the sealing member in the OLED display of FIG. 5.

FIG. 7 is a top plan view of an inner side of a sealing member in the OLED display of FIG. 5; and FIG. 8 is a top plan view of an outer side of the sealing member in the OLED display of FIG. 5.

FIG. 5 is a cross-section taken along the line A-A of FIG. 7.

Referring to FIG. 5 thru FIG. 8, the first metal sheet 111 includes a center portion 111a attached to the thermosetting adhesive layer 13 and extending portions 111b extending toward the edges of the insulation sheet 51 so as to face the first pad portions 45. The second metal sheet 112 is disposed at a location facing the second pad portions 46 among the edges of the insulation sheet 51, and is distanced from the first metal sheet 111 between the extending portions 111b of the first metal sheet 111.

Conductive adhering layers 48 are disposed on the first pad portion 45 and the second pad portion 46. The conductive adhering layers 48 are disposed between the first pad portion 45 and the extended portion 111b so as to connect the first pad 45 to the first metal sheet 111, and are disposed between the second pad portion 46 and the second metal sheet 112 for connection therebetween. The conductive adhering layer 48 has conductivity only in a thickness direction of the substrate 40, and becomes insulative in directions other than the thickness direction. Thus, the first pad portions 45 and the second pad portions 46 are not short-circuited even though one conductive adhering layer 48 contacts both the first pad portions 45 and the second pad portions 46.

The first metal sheet 111 may be connected to a third metal sheet 113 attached to the outer side of the insulation sheet 51 and may receive an electrical signal therefrom, and may be connected to a fourth metal sheet 114 attached to the outer side of the insulation sheet 51 and may receive an electrical signal therefrom. The fourth metal sheet 114 may be formed along the edges of the insulation sheet 51. The third metal sheet 113 may be disposed at a distance from the third metal sheet 113 in the fourth metal sheet 114.

In the insulation sheet 51, a first opening is formed at an overlapped portion of the first metal sheet 111 and the third metal sheet 113, and a conductive material is filled in the first opening such that a first conductive connection portion 521 is formed. In addition, in the insulation sheet 51, a second opening is formed at an overlapped portion of the second metal sheet 112 and the fourth metal sheet 114, and a conductive material is filled in the second opening such that a second conductive connection portion 522 is formed.

An external access terminal (not shown) is attached to the third and fourth metal sheets 113 and 114, respectively. Thus, a first electric signal applied to the third metal sheet 113 is transmitted to the common electrode 44 of the display unit 41 through the first metal sheet 111, the conductive adhering layer 48 and the first pad portion 45, and a second electric signal applied to the fourth metal sheet 114 is transmitted to the common power line 43 of the display unit 41 through the second metal sheet 112, the conductive adhering layer 48 and the second pad portion 46.

In the above-stated OLED display 200, the corresponding electric signal can be uniformly applied to the common power line 43 and the common electrode 44 without forming pad areas 47 at four (up, down, left, and right) edges of the substrate 40 while realizing a large-sized display unit 41. As a result, the entire structure and manufacturing process of the OLED display 200 can be simplified while preventing luminance non-uniformity due to manufacturing of a large-sized display unit 41.

Figure 9:
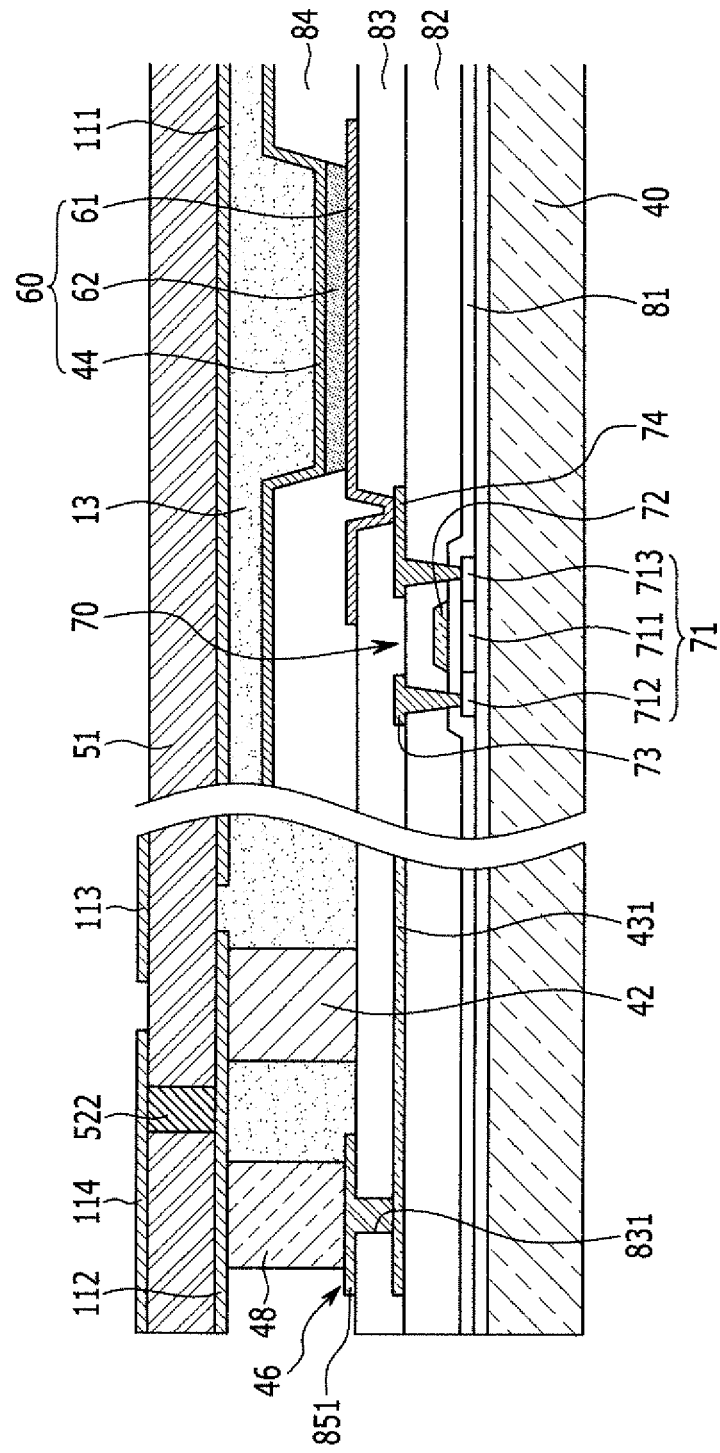
FIG. 9 thru FIG. 11 are partially enlarged cross-sectional views of the OLED display of FIG. 5.
Figure 10:
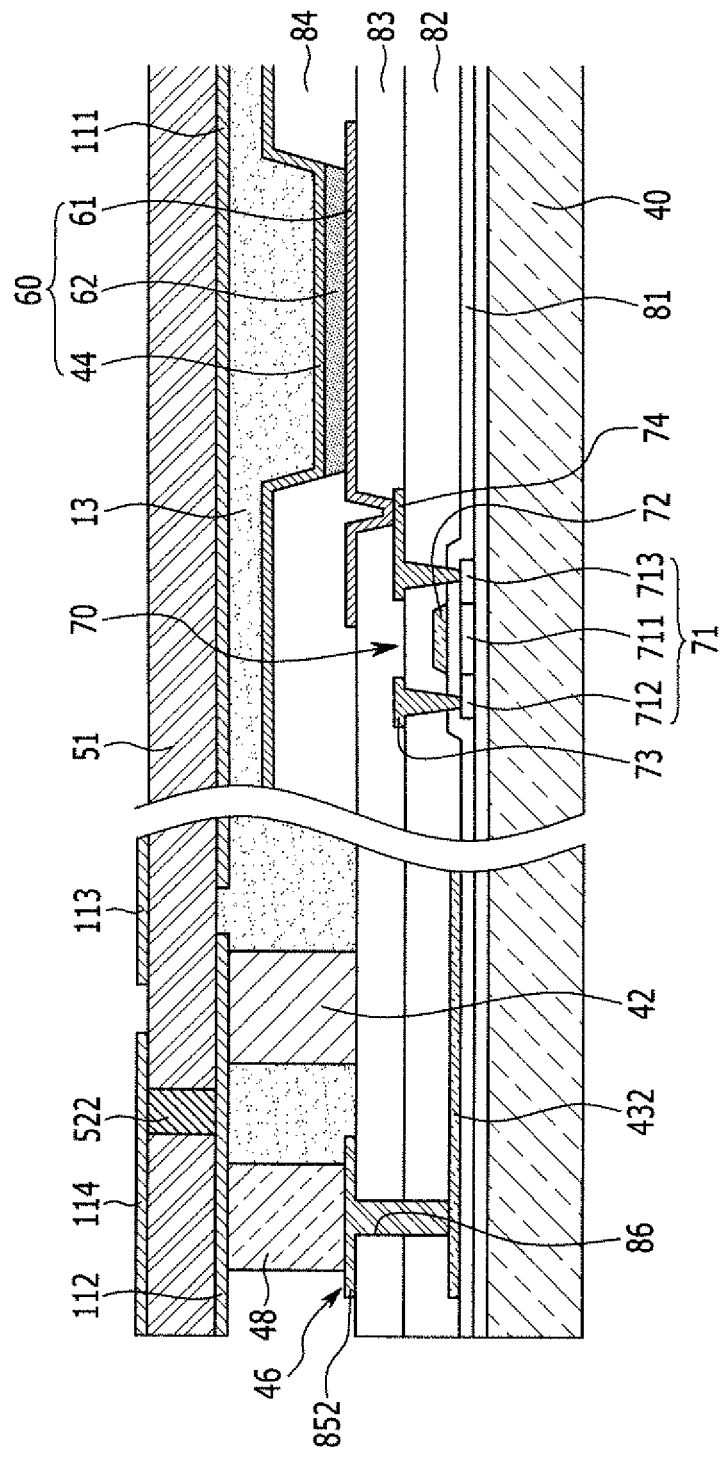
Figure 11:
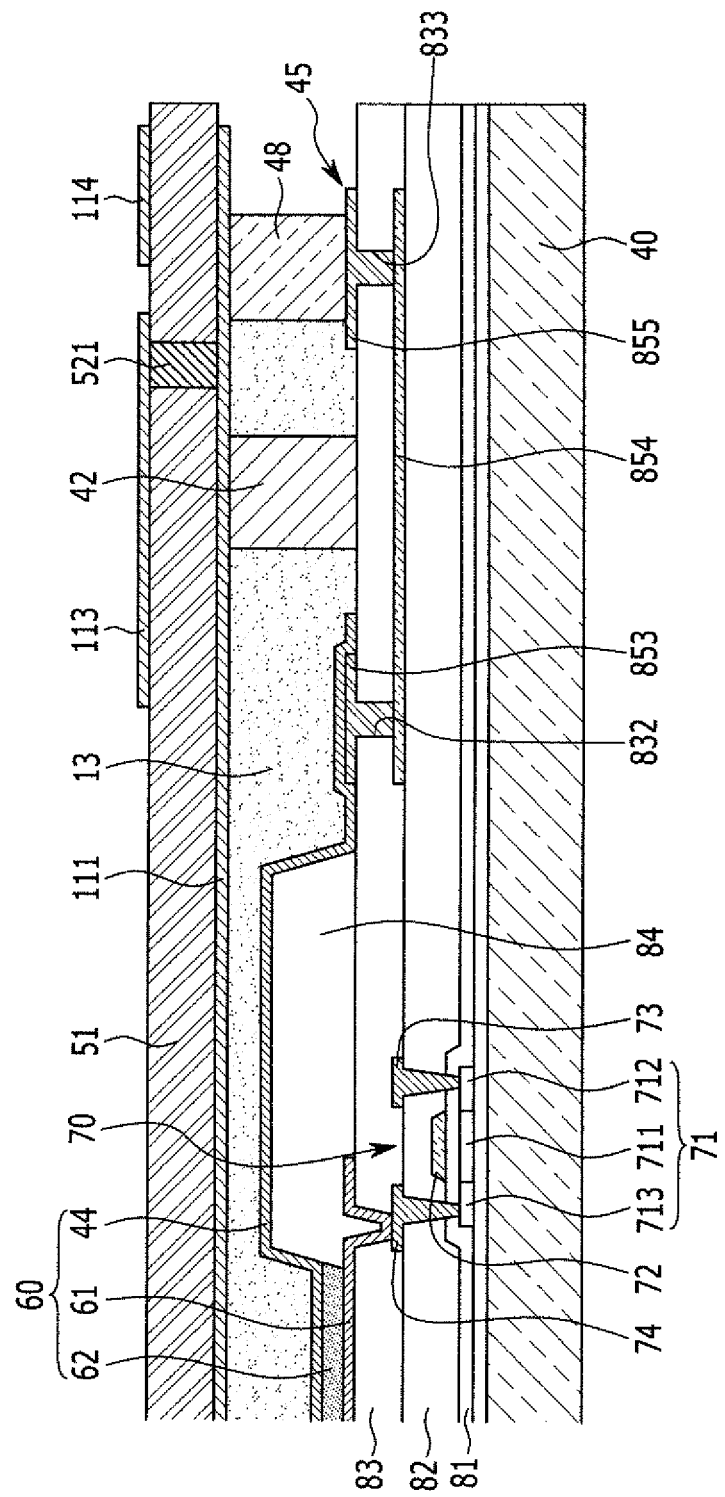

FIG. 9 thru FIG. 11 are partially enlarged cross-sectional views of the OLED display of FIG. 5.

FIG. 9 illustrates a first common power line 431 and a second pad portion 46 in detail, and FIG. 10 illustrates a second common power line 432 and the second pad portion 46 in detail. FIG. 11 illustrates the common electrode 44 and a first pad portion 45 in detail.

Referring to FIG. 9 thru FIG. 11, an organic light emitting element 60 and a driving circuit are formed at each pixel in the display unit. FIG. 9 thru FIG. 11 schematically illustrate that one thin film transistor 70 and one organic light emitting element 60 are disposed in the display unit.

Thin film transistor 70 includes a semiconductor layer 71, a gate electrode 72, a source electrode 73 and a drain electrode 74. The semiconductor layer 71 is formed with a polycrystalline silicon layer, and includes a channel area 711, a source area 712 and a drain area 713. The channel area 711 is an intrinsic semiconductor which is not doped with an impurity, and the source area 712 and the drain area 713 are impurity-doped impurity semiconductors.

The gate electrode 72 is disposed on the channel area 711 of the semiconductor layer 71, with a gate insulating layer 81 disposed therebetween. The source electrode 73 and the drain electrode 74 are disposed on the gate electrode 72, with an interlayer insulating layer 82 disposed therebetween, and are connected to the source area 712 and the drain area 713, respectively, through a contact hole formed in the interlayer insulating layer 82. A planarization layer 83 is formed on the source electrode 73 and the drain electrode 74, and a pixel electrode 61 is disposed on the planarization layer 83. The pixel electrode 61 is connected to the drain electrode 74 through a contact hole of the planarization layer 83.

A pixel definition layer 84 is disposed on the pixel electrode 61 and the planarization layer 83. The pixel definition layer 84 partially exposes the pixel electrode 61 by forming an opening in each pixel. An organic emission layer 62 is formed over the exposed pixel electrode 61, and a common electrode 44 is formed over the entire display unit so as to cover the organic emission layer 62 and the pixel definition layer 84. The pixel electrode 61, the organic emission layer 62 and the common electrode 44 form an organic light emitting element 60.

The pixel electrode 61 may be a hole injection electrode and the common electrode 44 may be an electron injection electrode. In this case, the organic emission layer 62 may be formed with a hole injection layer (HIL), a hole transport layer (HTL), an emission layer, an electron transport layer (ETL), and an electron injection layer (EIL) which are sequentially stacked from the pixel electrode 61. Holes and electrons are injected toward the organic emission layer 62 from the pixel electrode 61 and the common electrode 44, and emission of light from the organic emission layer 62 is made when the excitons, being the combination of the injected holes and electrodes, drop from the excited state to the ground state.

The pixel electrode 61 is formed as a transflective conductive layer and the common electrode 44 is formed as a reflective conductive layer. Light emitted from the organic emission layer 62 is reflected by the common electrode 44 and emitted to the outside through the pixel electrode 61 and the substrate 40. Such a light emission structure is a bottom emission type. The pixel electrode 61 may be formed with a triple-layered film of ITO/silver (Ag)/ITO, and the common electrode 44 may include silver (Ag) or aluminum (Al).

Referring to FIG. 9 and FIG. 10, the first common power line 431 and the second common power line 432 may be formed at the same layer of the gate electrode 72 or the source/drain electrodes 73 and 74. End portions of the first and second common power lines 431 and 432, respectively, are extended to the external side of the display unit. In addition, at least one of four insulation layers formed in the display unit is extended to the external side of the display unit. For example, the end portion of the first common power line 431 may be covered by the planarization layer 83 and the end portion of the second common power line 432 may be covered by the interlayer insulating layer 82 and the planarization layer 83.

The planarization layer 83 forms a first opening 831 so as to expose the end portion of the first common power line 431, and a first pad conductive layer 851 is formed on the planarization layer 83 and connected to the first common power line 431 through the first opening 831. A second pad portion 46 disposed at the long side of the substrate 40 may be defined as the first pad conductive layer 851.

The interlayer insulating layer 82 and the planarization layer 83 form a second opening 86 so as to expose the end portion of the second common power line 432, and a second pad conductive layer 852 is formed on the planarization layer 83 and connected to the second common power line 432 through the second opening 86. A second pad portion 46 disposed at the short side of the substrate 40 may be defined as the second pad conductive layer 852. The first pad conductive layer 851 and the second pad conductive layer 852 may be formed at the same layer of the pixel electrode 61 with the same material of the pixel electrode 61.

Referring to FIG. 11, the common electrode 44 is disposed at an inner side of the getter layer 42, and the first pad portion 45 is formed over the inner and outer sides of the getter layer 42 such that the common electrode 44 and the conductive adhering layer 48 are connected to each other. The first pad portion 45 includes a third pad conductive layer 853, a fourth pad conductive layer 854, and a fifth pad conductive layer 855.

The third pad conductive layer 853 is disposed at the inner side of the getter layer 42 and contacts the common electrode 44. The fourth pad conductive layer 854 is connected to the third pad conductive layer 853 through a third opening of the planarization layer 83, and is disposed over the inner and outer sides of the getter layer 42. A fifth pad conductive layer 855 is disposed between the conductive adhering layer 48 and the planarization layer 83, and is connected to the fourth pad conductive layer 854 through a fourth opening 833 of the planarization layer 83.

The third pad conductive layer 853 and the fifth pad conductive layer 855 may be formed with the same material at the same layer of the pixel electrode 61. In addition, the fourth pad conductive layer 854 may be formed with the same material as the same layer of the gate electrode 72 or the source/drain electrodes 73 and 74. However, a detailed structure of the first pad portion 45 is not limited to the illustrated example, and any structure in which the common electrode 44 of the display unit and the conductive adhering layer 48 at the external side of the getter layer 42 are conductive can be applied.

The display unit illustrated in FIG. 9 thru FIG. 11 is not restrictive, and the structures of the thin film transistor 70 and the organic light emitting element 60 may be variously modified.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a substrate;
   a display unit formed on the substrate and including a plurality of pixels;
   a getter layer disposed at an external side of the display unit on the substrate;
   a metal sheet fixed on a thermosetting adhesive layer, and covering the entire display unit; the thermosetting adhesive layer fills a space between the metal sheet and a common electrode covering the entire display unit and a pixel definition layer;
   an insulation sheet fixed on the metal sheet;
   the display unit comprising a common power line and the common electrode;
   the metal sheet comprising a first metal sheet connected to the common electrode to supply a first electric signal to the common electrode, and a second metal sheet connected to the common power line to supply a second electric signal to the common power line;
   a first pad portion disposed at an external side of the thermosetting adhesive layer and connected to the common electrode;
   a second pad portion disposed at the external side of the thermosetting adhesive layer and connected to the common power line; and
   conductive adhering layers disposed between the first pad portion and the first metal sheet, and between the second pad portion and the second metal sheet.

2. The OLED display device of claim 1, the thermosetting adhesive layer being divided into a first area disposed at an inner side of the getter layer and a second area disposed at an outer side of the getter layer.

3. The OLED display device of claim 2, the first area being sealed to the display unit and disposed between the display unit and the metal sheet along a thickness direction of the substrate.

4. The OLED display device of claim 2, the second area being formed along an edge of the metal sheet to adhere the substrate and the metal sheet.

5. The OLED display device of claim 1, the getter layer being disposed at a distance from the thermosetting adhesive layer.

6. The OLED display device of claim 1, the conductive adhering layer has a conductivity along a thickness direction of the substrate, and becomes insulative along directions other than the thickness direction of the substrate.

7. The OLED display device of claim 1, further comprising:
   a third metal sheet fixed to an external side of the insulation sheet, and connected to the first metal sheet by a first conductive connection portion penetrating through the insulation sheet; and
   a fourth metal sheet fixed to the external side of the insulation sheet at a distance from the third metal sheet, and connected to the second metal sheet by a second conductive connection portion penetrating through the insulation sheet.

8. The OLED display device of claim 1, the thermosetting adhesive layer, having a getter receiving portion, being disposed on a metal sheet.

9. The OLED display device of claim 8, the thermosetting adhesive layer and the metal sheet being adhered to the substrate to locate the getter layer in the getter receiving portion.

10. The OLED display device of claim 9, the getter receiving portion being a portion where the thermosetting adhesive is not formed and thus exposing the surface of the metal sheet.

11. The OLED display device of claim 10, the getter receiving portion being disposed in parallel with an edge of the metal sheet at a distance therefrom.

12. The OLED display device of claim 11, the getter receiving portion having a constant width.

* * * * *